United States Patent [19]

Matsugatani et al.

[11] Patent Number: 5,367,182
[45] Date of Patent: Nov. 22, 1994

[54] COMPOUND SEMICONDUCTOR DEVICE FOR REDUCING THE INFLUENCE OF RESISTANCE ANISOTROPY ON OPERATING CHARACTERISTICS THEREOF

[75] Inventors: Kazuoki Matsugatani, Nishikamo; Takashi Taguchi, Anjo; Yoshiki Ueno, Okazaki, all of Japan

[73] Assignee: Nippondenso Co., Ltd., Kariya, Japan

[21] Appl. No.: 35,754

[22] Filed: Mar. 24, 1993

[30] Foreign Application Priority Data

Mar. 25, 1992 [JP] Japan ................... 4-067227
Mar. 25, 1992 [JP] Japan ................... 4-067235

[51] Int. Cl.$^5$ .................... H01L 29/06; H01L 29/203
[52] U.S. Cl. ......................... 257/190; 257/194
[58] Field of Search ................ 257/18, 19, 20, 24, 257/194, 190, 64, 627, 628

[56] References Cited

U.S. PATENT DOCUMENTS 4,745,449 5/1988 Chang et al. ................ 257/280

FOREIGN PATENT DOCUMENTS 0049242 3/1991 Japan.
0180240 6/1992 Japan.
0294547 10/1992 Japan.

OTHER PUBLICATIONS

Kavanagh et al., "Asymmetries In Dislocation Densities, Surface Morphology, and Strain of GaInAs/GaAs Single Heterolayers", Journal of Applied physics, vol. 64, Nov. 15, 1988, pp. 4843-4852.

Highly anisotropic electron mobilities of GaAs/In0.-2Ga0.8As/A/AI0.3Ga0.7As inverted high electron mobility mobility transistor structures, T. Schweizer et al, pp. 2736-2738.

Orientation dependence of mismatched InxAl1-xAs-/In0,53Ga0.47As HFETs, Journal of Crystal Growth 111 (1991) 479-483 North-Holland.

Electronic properties of two-dimensional electron GAS in pseudomorphic InxGa1-As/N-In0.52AI0.-48As Heterostructures, Journal of Crystal Growth 95 (1989 189-192, North-Holland, Amsterdam.

Lattice-Mismatched Growth and Transport Properties of In AIAs/In GaAs Heterostructures on GaAs Substrates Japanese Journal of Applied Physics, vol. 28, No. 7 Jul. 1989, pp. L1101-:L1103.

*Primary Examiner*—Robert Limanek
*Assistant Examiner*—David B. Hardy
*Attorney, Agent, or Firm*—Cushman & Darby & Cushman

[57] ABSTRACT

A compound semiconductor device including a semiconductor substrate having (100) plane as a crystal growth plane, a first semiconductor layer as an electron traveling layer and a second semiconductor layer for supplying electrons to the electron traveling layer. The first semiconductor layer is formed on the semiconductor substrate and has a different lattice constant from the semiconductor substrate so that a first strain is applied in the first semiconductor layer in a first strain direction. The second semiconductor layer is formed on the first semiconductor layer and has a different lattice constant from the first semiconductor layer to thereby apply a second strain to the second semiconductor layer. The second strain has a direction that is inverse to the first strain direction. In addition, the thickness of the semiconductor layer is defined so as to compensate for the first strain applied to the first semiconductor layer by the second strain applied to the second semiconductor.

4 Claims, 8 Drawing Sheets

- 6 n-InGaAs (In 65%)
- 5 n-InAlAs (In 65%)
- 4 InAlAs (In 65%)
- 3 InGaAs (In 80%)
- 2 InAlAs (In 0%~70%)
- 1 GaAs

- 6 n-InGaAs (In 50%)
- 5 n-InAlAs (In 50%)
- 4 InAlAs (In 50%)
- 3 InGaAs (In 80%)
- 2 InAlAs (In 52%)
- 1 InP

COMPOUND SEMICONDUCTOR DEVICE FOR REDUCING THE INFLUENCE OF RESISTANCE ANISOTROPY ON OPERATING CHARACTERISTICS THEREOF

BACKGROUND OF THE INVENTION

1. Field of the Invention

The present invention relates to a field effect transistor and more particularly to an improved high electron mobility field effect transistor (HEMT) using electrons quantized into 2D.

2. Description of the Related Arts

A high electron mobility field effect transistor (HEMT) which is composed of such compound semiconductors as GaAs, a material having a higher mobility than Si, and uses 2D electron gas (2DEG) layer is known as a transistor suitable for high speed operations such as amplification of high frequency and high speed switching. The HEMT is characterized in that a layer (channel layer) in which electrons travel and a layer (donor layer) through which the electrons are supplied are separated, and the electrons are stored as 2D electron gas in a quantum well created at the hetero-interface of the channel layer and the donor layer. A spacer layer may be interposed between the channel layer and the donor layer to prevent scattering of the electrons.

A structure called a pseudomorphic HEMT using InGaAs which has a higher electron mobility than GaAs for the channel material has been proposed in an effort to improve the performance of the HEMT. Although the electron mobility is surely improved by adding In to GaAs, it is known that the lattice constant is increased and strain is applied to the crystal lattice of the InGaAs layer.

If a layer having a different lattice constant is grown on a substrate material, strain is applied to the crystal growth layer and the bond of atoms is cut by the strain, causing dislocations. It is known that there exists a certain regularity in the direction in which the dislocations are caused and according to "Journal of Crystal Growth 111" (1991) pp. 479–483 for example, it is reported that in a case of crystal growth in the [100] axial direction, dislocations along [011] axis are preferentially generated when the crystal growth layer is subjected to compression strain and when it is subjected to tension strain in contrary, dislocations in the direction along [01$\bar{1}$] axis are preferentially generated.

When electrons traveling in the channel layer cross the dislocated plane, they are scattered and the mobility of the electrons is degraded. Further, the flow of the electrons crossing the dislocated plane is blocked because the amount of stored electrons is locally reduced at the portion where the dislocated plane existing in the donor layer or spacer layer contacts with the channel layer. In any case, it results in increased resistances due to the aforementioned reasons. If dislocations are produced preferentially in certain crystal orientations in a crystal layer having such strain, a phenomenon in which the resistances vary depending on crystal axes, i.e. a resistance anisotropy, is brought about. Although elements have been formed without paying any attention to this resistance anisotropy in the prior art, there has been a problem that when elements are to be formed on a semiconductor operating layer having such resistance anisotropy, performance of the elements is degraded due to the influence of the resistance anisotropy as the increase of parasitic resistance or the degradation of mobility of electrons by the scattering, if the elements are disposed in a manner flowing electrons along the direction where the resistance is high.

Accordingly, it is an object of the present invention to overcome the aforementioned problems by providing a field effect transistor which is able to suppress the influence of degradation of performance of elements caused by to the resistance anisotropy.

SUMMARY OF THE INVENTION

The inventors of the present invention noticed that the directions of the dislocations preferentially generated when strain is applied to a crystal growth layer differ depending on the direction of the strain, i.e. they differ by 90° in cases when the direction of the strain is that of compression and of tension, and designed a device so that strains having inverse directions from each other are applied to a channel layer, spacer layer or donor layer and to adjust the ratio of thicknesses of the layer on which the compression strain is applied and of the layer on which the tension strain is applied. That is, according to the present invention, in a HEMT having crystal growth layers in which strain is applied, materials or compositions of the substrate, buffer layer, channel layer and donor layer, which generally constitute the HEMT, are appropriately selected to form the channel layer, spacer layer or donor layer so as to have strains in the inverse directions from each other to control the resistance anisotropy caused by the strains by adjusting the magnitude of the strains applied to the elements as a whole.

In particular, in a field effect transistor having a semiconductor layer which is grown on a (100) plane formed on a semiconductor substrate as an operating layer, a channel layer through which electrons travel and a donor layer which supplies the electrons, the field effect transistor is characterized in that:

a material having a greater lattice constant than the material of the substrate or the material at the uppermost surface of a buffer layer interposed between the substrate and the channel layer is used as the material of the channel layer and compression strain is applied to the channel layer and on the other hand, a material having a smaller lattice constant than the material of the channel layer is used as the material of the spacer layer or the donor layer and tension strain is applied to the spacer layer or the donor layer or to both layers; and the thickness of the layer on which the tension strain is applied is set so that the compression strain given to the channel layer is compensated by this tension strain.

Further, in a field effect transistor having a semiconductor layer which is grown on a (100) plane formed on a semiconductor substrate as an operating layer, a channel layer through which electrons travel and a donor layer which supplies the electrons, the field effect transistor is characterized in that:

a material having a smaller lattice constant than the material of the substrate or the material at the uppermost surface of a buffer layer interposed between the substrate and the channel layer is used as the material of the channel layer and tension strain is applied to the channel layer and on the other hand, a material having a greater lattice constant than the material of the channel layer is used as the material of the spacer layer or the donor layer and compression strain is applied to the spacer layer or the donor layer or to both layers; and the thickness of the layer on which the compression strain is applied is set so that the tension strain given to the channel layer is compensated by this compression strain.

The ratio of the thicknesses of the layer on which the compression strain is applied and of the layer on which the tension strain is applied is regulated in the manner as described above and the strains in the semiconductor operating layer are compensated as a whole. Therefore, the resistances in the [011] axial direction and in the [01$\bar{1}$] axial direction in which dislocations are preferentially generated depending on strain may be almost equalized. As a result, the resistances in any directions within the semiconductor operating layer are equalized, so that electrodes of the device may be disposed without paying a special attention to the crystal orientations on which current flows. Accordingly, it improves the degree of freedom in designing a circuits of microwave monolithic IC (MMIC) and improves the degree of integration when integrating the circuit.

Further, according to the present invention, it is also possible to create a device in which the influence of scattering due to dislocations is minimized and the electrodes are disposed in a desired crystal orientation by arbitrary controlling the crystal orientation in which a resistance anisotropy is generated by forming the channel layer, spacer layer or donor layer so as to have strains in the opposite directions from each other and by regulating the magnitude of the strains applied to the device as a whole and by disposing the source, gate and drain electrodes along the axial direction in which the resistance is low.

In particular, in a field effect transistor having a semiconductor layer which is grown on a (100) plane formed on a semiconductor substrate as an operating layer, a channel layer through which electrons travel and a donor layer which supplies electrons, the field effect transistor is characterized in that:

a material having a greater lattice constant than the material of the substrate or the material at the uppermost surface of a buffer layer interposed between the substrate and the channel layer is used as the material of the channel layer and compression strain is applied to the channel layer and on the other hand, a material having a smaller lattice constant than the material of the channel layer is used as the material of the spacer layer or the donor layer and tension strain is applied to the spacer layer or the donor layer or to both layers;

source, gate and drain electrodes are disposed sequentially on or almost in the direction along the [011] axis when the spacer layer or the donor layer is thin and a resistance in the [011] axial direction is smaller than that in the [01$\bar{1}$] axial direction; and the source, gate and drain electrodes are disposed sequentially on or almost in the direction along the [01$\bar{1}$] axis when the spacer layer or the donor layer is thick and the resistance in the [01$\bar{1}$] axial direction is smaller than that in the [011] axial direction.

Further, in a field effect transistor having a semiconductor layer which is grown on a (100) plane formed on a semiconductor substrate as an operating layer, a channel layer through which electrons travel and a donor layer which supplies the electrons, the field effect transistor is characterized in that:

a material having a smaller lattice constant than the material of the substrate or the material at the uppermost surface of a buffer layer interposed between the substrate and the channel layer is used as the material of the channel layer and tension strain is applied to the channel layer and on the other hand, a material having a greater lattice constant than the material of the channel layer is used as the material of the spacer layer or the donor layer and compression strain is applied to the spacer layer or the donor layer or to both layers;

source, gate and drain electrodes are disposed sequentially on or almost in the direction along the [01$\bar{1}$] axis when the spacer layer or the donor layer is thin and the resistance in the [01$\bar{1}$] axial direction is smaller than that in the [011] axial direction; and the source, gate and drain electrodes are disposed sequentially on or almost in the direction along the [011] axis when the spacer layer or the donor layer is thick and the resistance in the [011] axial direction is smaller than that in the [01$\bar{1}$] axial direction.

The resistance anisotropy caused by the strains may be thus controlled by appropriately selecting the materials or compositions of the substrate, buffer layer, channel layer and donor layer. Further, the influence of degradation of device performance due to the resistance anisotropy may be prevented by disposing each of the source, gate and drain electrodes along the axial direction in which the resistance is reduced.

That is, when a device in which electrodes are disposed in a desired crystal orientation according to the use of the device is to be created, the present invention allows to control its resistance anisotropy so that its influence on the device performance is minimized.

The above objects and features of the invention will be apparent from a reading of the following description of the disclosure found in the accompanying drawings in which like numerals refer to like parts.

DETAILED DESCRIPTION OF PREFERRED EMBODIMENTS

Figure 1:
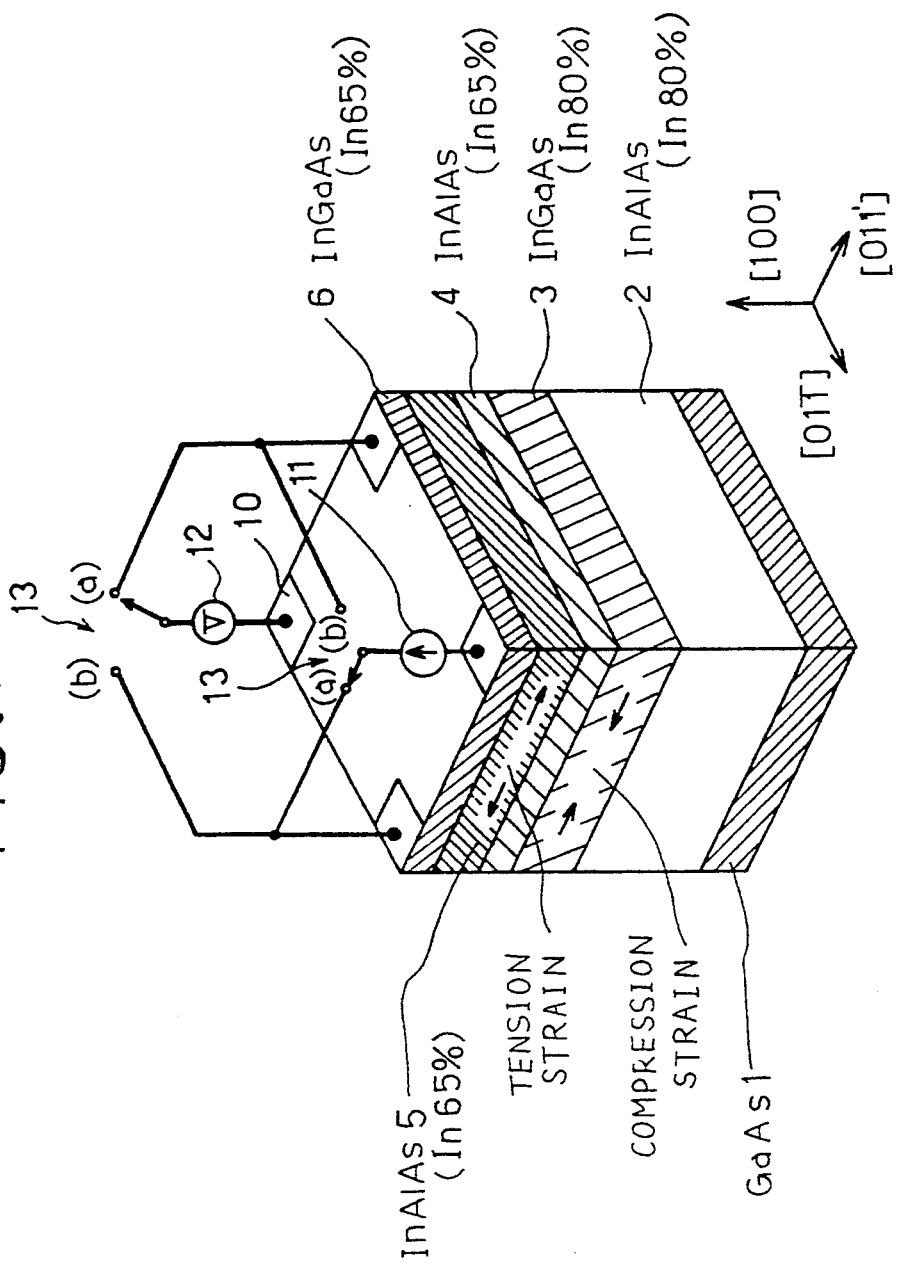
FIG. 1 is a perspective view illustrating a layer structure provided for explaining a resistance anisotropy.

Referring now to the preferred embodiments illustrated in the drawings, the present invention will be explained in detail.

FIG. 1 is a perspective view illustrating one example of a layer structure according to the principles of the invention. Exemplifying the structure shown in FIG. 1, a method for controlling a resistance anisotropy will be explained below.

At first, an InAlAs buffer layer 2, an InGaAs channel layer 3, an InAlAs spacer layer 4, a n-type InAlAs donor layer 5 and a n-type InGaAs cap layer 6 are grown sequentially on a semi-insulating GaAs(100) substrate 1 using MBE method and the like as shown in FIG. 1. In the present embodiment, conditions for forming each layer are as follows: the InAlAs buffer layer 2 is composed of 80% of In with 2 microm of thickness, the InGaAs channel layer 3; 80% In composition with 40 nm, the InAlAs spacer layer 4; 65% In composition with 5 nm, the n-type InAlAs donor layer 5; 65% In composition with 5 to 40 nm and the n-type InGaAs cap layer 6; 65% In composition with 5 nm and an impurity density of the donor layer 5 and cap layer 6 is $2 \times 10^{18}$ cm$^{-3}$. With this structure, 2D electron gas is produced on the interface side of the InAlAs spacer layer 4 within the InGaAs channel layer 3. The spacer layer 4 acts to increase a spatial separation of n-type impurities added to the donor layer 5 and the 2D electron gas to increase the mobility and the cap layer 6 acts to prevent the donor layer 5 from being oxidized.

Generally InAlAs and InGaAs have an almost equal lattice constant when the In composition is the same and have a tendency that the lattice constant increases as the In composition increases as compared to GaAs. In the structure shown in FIG. 1, the channel layer 3 is fabricated using InGaAs (80% In composition) and compression strain remains within the channel layer 3 though the buffer layer 2 is interposed. On the other hand, tension strain to the channel layer 3 is applied within the spacer layer 4, donor layer 5 and cap layer 6 since 65% In composition InGaAs and InAlAs are used in them.

Figure 2:
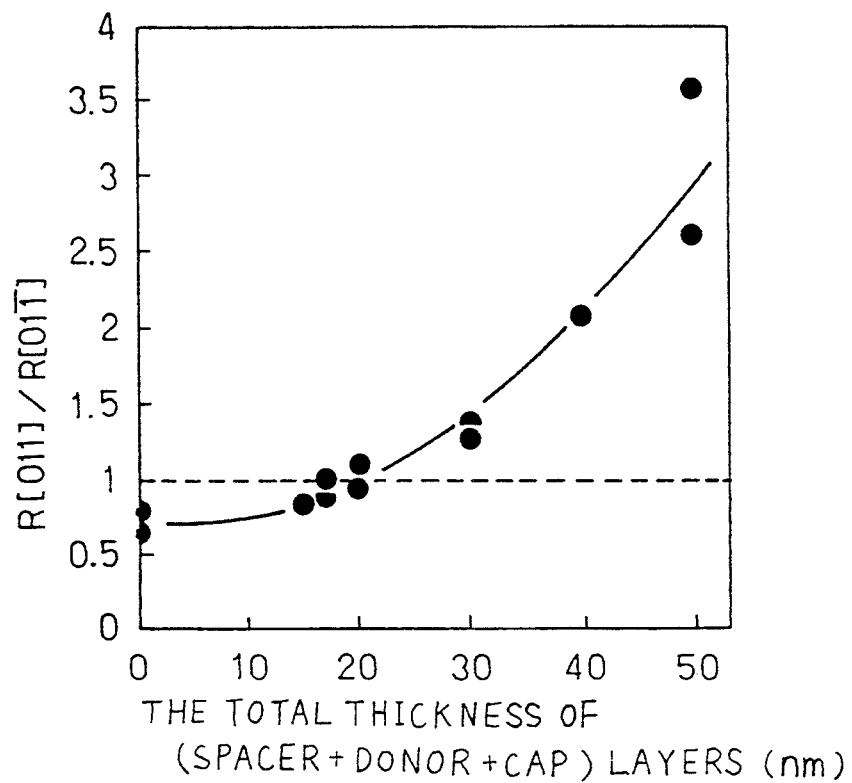
FIG. 2 is a characteristic diagram showing the resistance anisotropy when layer thickness of InAlAs donor layer is changed in FIG. 1.

In this structure, several samples in which the layer thickness of the InAlAs donor layer 5 is changed in a range of 5 nm to 40 nm are fabricated, ohmic electrodes 10 are formed on the surface as shown in FIG. 1 and a power source 11 for flowing a constant current and a volt meter 12 for measuring potential between electrodes are connected. A resistance R [011] in the [011] axial direction is found by switching contacts of switches 13 provided at two places to (a) and a resistance R [01$\bar{1}$] in the [01$\bar{1}$] axial direction is found by switching them to (b), respectively. FIG. 2 shows a ratio of the both.

It is understood from FIG. 2 that when the resistance R [011] in the [011] axial direction and the resistance R [01$\bar{1}$] in the [01$\bar{1}$] axial direction are compared, although R [011]<R [01$\bar{1}$] when the donor layer 5 is below 10 nm (i.e., the thickness of the spacer+donor+cap layers on which tension strain is applied is below 20 nm), the direction of the anisotropy interchanges and it becomes R [011]>R [01$\bar{1}$] when the thickness of the donor layer is above that.

That is, according to the layer structure shown in FIG. 1, it can be seen that R [011]=R [01$\bar{1}$] may be achieved and the resistance anisotropy may be canceled out by reducing the In composition ratio to reduce the lattice constant of the carrier supply side layer as against the channel layer 3 in which compression strain residues and thereby to generate tension strain in the former and by adjusting the thickness of the donor layer 5 to approximately 10 nm (i.e., to approximately 20 nm of the total thickness of the spacer layer 4, donor layer 5 and cap layer 6 on which the tension strain is applied).

[First Embodiment]

Figure 3:
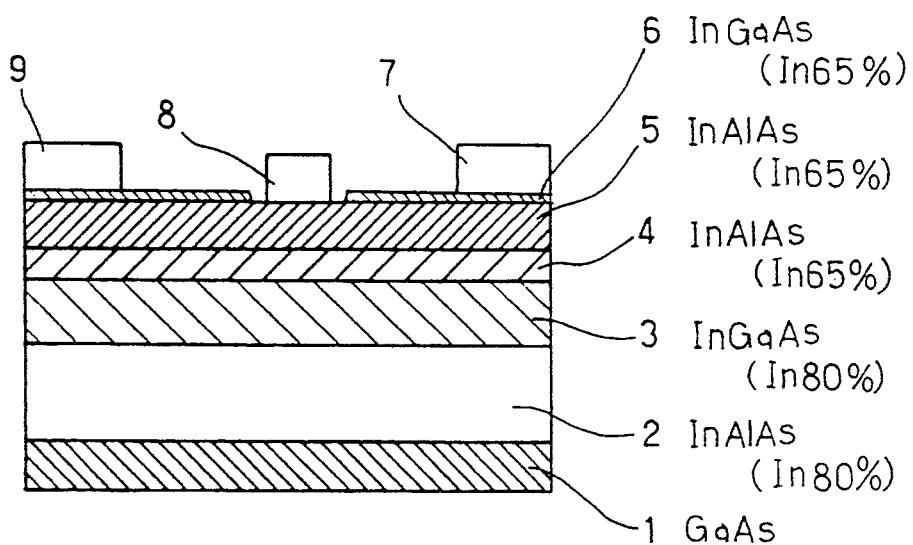
FIG. 3 is a schematic structural drawing of a HEMT device according to a first embodiment of the present invention.

FIG. 3 shows a first embodiment in which the structure shown in FIG. 1 is actually applied to HEMT. Arrangements of each semiconductor layer are the same with that shown in FIG. 1 and the InAlAs buffer layer 2, InGaAs channel layer 3 (In composition is 80% in the both layers), InAlAs spacer layer 4, n-type InAlAs donor layer 5 and n-type InGaAs cap layer (In composition is 65% in the latter three layers) are laminated one by one on a semi-insulating GaAs(100) substrate 1 using MBE method and the like. The thickness of the cap layer 6 is so thin as 1 to 2 nm for example so that Al atoms contained in the donor layer 5 would not be oxidized during manufacturing process.

Further, as described above, according to the layer structuring conditions shown in FIGS. 1 and 3, it is possible to cancel out the resistance anisotropy when the total thickness of the layers on which the tension strain is applied is approximately 20 nm. Then in the present embodiment, the spacer layer 4 is set to be 5 nm and the donor layer 5 is set to be 15 nm. When it is desired to adjust the concentration of the 2D electron gas, the concentration of the impurities of the donor added to the donor layer 5 is changed.

When a HEMT device is formed using this semiconductor substrate, a leak current when gate bias is applied may be reduced by forming a gate electrode 8 after removing only the cap layer 6 at the uppermost surface while forming a source electrode 7 and drain electrode 9 directly on the cap layer 6. By the way, since the thickness of the cap layer 6 is thinly set beforehand, the total thicknesses on which the tension strain is applied of directly below the gate electrode 8 and of other part are kept almost the same, causing no problem in terms of the resistance anisotropy.

Since the resistance anisotropy may be thus canceled out in the present embodiment, no restriction is imposed on the location of the source electrode 7, gate electrode 8 and drain electrode 9, improving the degree of freedom in designing the circuit and the degree of integration when integrating the circuit. By the way, it is sufficient if the resistance anisotropy is virtually eliminated and it is possible for example to allow a certain allowance from 20 nm described above of the total thickness of the layers on which the tension strain is applied. That is, an equal effect may be expected even if the thickness is 15 to 25 nm.

Further, since the 2D electron gas in which electrons travel is produced in the InGaAs channel layer 3 having high In composition ratio of 80% of In composition, its electron mobility is higher and the electron density of the 2D electron gas may be kept large by keeping large the band discontinuity with the channel layer 3 by composing the donor layer 5 and others on the carrier supply side by 65% of In composition.

The device performance and high frequency characteristics required especially for microwave devices are influenced most by the characteristics of the 2D electron gas in the portion directly below where the gate electrode contacts. Accordingly, when the present embodiment is applied to a recess gate structure, the influence of anisotropy may be mostly eliminated by designing the total thickness of the layers (total thickness of the donor layer+spacer layer in the present embodiment) which are subjected to the tension strain at the portion which remains after recess etching, i.e. the portion directly below the gate electrode, to be approximately 20 nm.

Although the InAlAs buffer layer with 80% of In composition has been formed directly above the GaAs substrate 1 in the first embodiment, it is sufficient if the resistance anisotropy can be canceled out in the device as a whole by applying strains in the inverse directions from each other to the channel layer 3, spacer layer 4 or donor layer 5 and hence some other embodiments are conceivable.

[Second Embodiment]

Figure 4A:
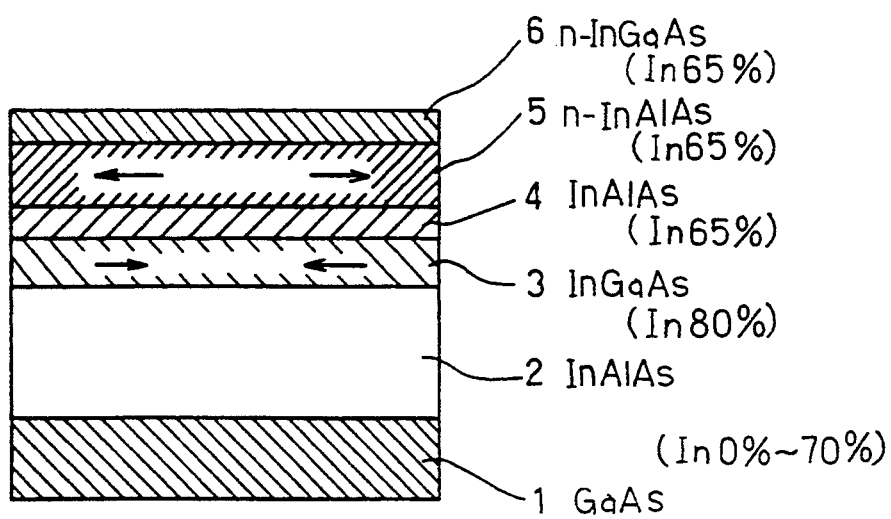
FIGS. 4A and 4B are schematic drawings of layer structures according a second embodiment of the invention.
Figure 4B:
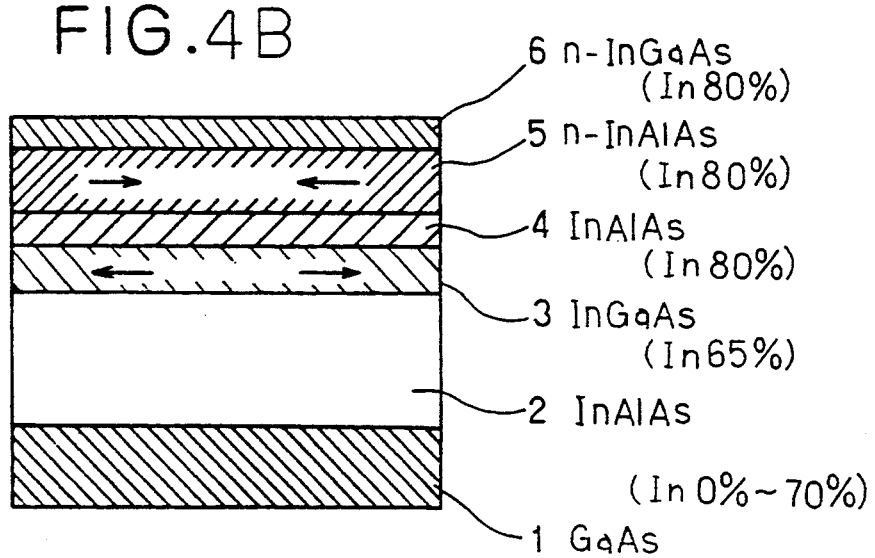

FIGS. 4A and 4B are schematic drawings of layer structures according to a second embodiment of the invention, wherein a so-called grated buffer layer in which the In composition is gradually increased from 0% is employed as the buffer layer 2 formed on the semi-insulating GaAs (100) substrate 1. This structure features in that the magnitude and direction of strains applied to the channel layer 3 may be more widely adjusted by changing the In composition on the uppermost surface of the grated buffer layer 2 and that of the channel layer 3. In the structure shown in FIG. 4A, the strain applied to the channel layer 3 is a compression strain, the In composition at the uppermost surface of the InAlAs grated buffer layer 2 is 70%, the In composition of InGaAs channel layer 3 is 80% and a tension strain is given on the upper layers of InAlAs spacer layer 4, n-InAlAs donor layer 5 and n-InGaAs cap layer 6 having 65% of In composition.

Further in the structure shown in FIG. 4B, the strain applied to the channel layer 3 is a tension strain, the composition at the uppermost surface of the InAlAs grated buffer layer 2 is 70%, the In composition of InGaAs channel layer 3 is 65% and a compression strain is given on the upper layers of the InAlAs spacer layer 4, n-InAlAs donor layer 5 and n-InGaAs cap layer 6 having 80% of In composition. It is also possible to cancel out the resistance anisotropy in the present embodiment by controlling the layer thickness of and adjusting the strain magnitude of the spacer, donor and cap layers on the carrier supply side in the inverse direction as against the strain generated in the channel layer 3 in the same manner as in the first embodiment.

[Third Embodiment]

Although examples using GaAs as the material of the substrate have been shown in the aforementioned embodiments, it is possible to create the same structure by using a substrate of another material capable of growing crystal, such as InP and InAs, and by interposing a buffer layer or a grated buffer layer whose lattice constant corresponds to that of the respective substrates.

Figure 5A:
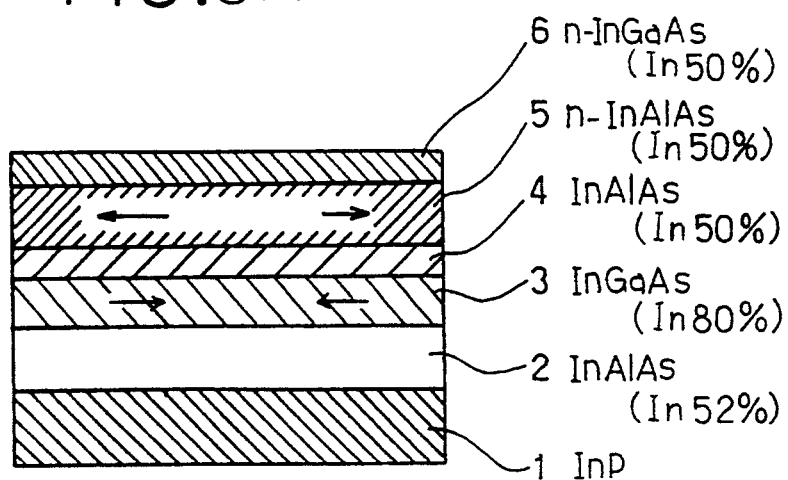
FIGS. 5A and 5B are schematic drawings of layer structures according to a third embodiment of the invention.
Figure 5B:
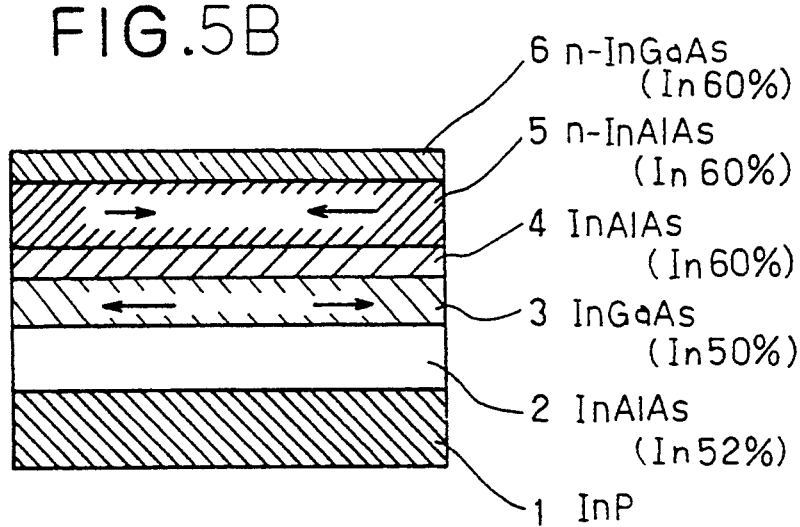

FIGS. 5A and 5B are schematic drawings of layer structures according to a third embodiment of the invention, wherein a semi-insulating InP (100) is used for the material of the substrate 1 and the buffer layer 2 is fabricated by InAlAs with 52% of In composition whose lattice matches with InP. In this structure, the lattice of the buffer layer 2 matches with the substrate 1, differing from the aforementioned first and second embodiments, and no strain is applied to the buffer layer 2. Accordingly, strain applied to the InGaAs channel layer 3 is determined only by the In composition of the channel layer and the magnitude of strain on the channel layer may be precisely defined. That is, as shown in FIG. 5A, a compression strain is applied to the channel layer 3 by increasing the In composition of the InGaAs channel layer 3 to 80% which is higher than that of the buffer layer 2, and the magnitude of the strain is defined as corresponding to the thickness. Then the resistance anisotropy may be canceled out by giving a tension strain to the InAlAs spacer layer 4, n-InAlAs donor layer 5 and n-InGaAs cap layer 6 by decreasing the In composition to, for example, 50% which is less than that of the channel layer 3 and by compensating and adjusting the thickness thereof to the magnitude of the compression strain of the channel layer 3. Further, as shown in FIG. 5B, a tension strain is applied to the channel layer 3 by reducing the In composition of the InGaAs channel layer 3 to 50% which is less than the buffer layer 2, and the strain magnitude is defined as corresponding to the thickness. Then the resistance anisotropy may be canceled out by giving a compression strain to the InAlAs spacer layer 4, n-InAlAs donor layer 5 and n-InGaAs cap layer 6 by increasing the In composition to, for example, 60% which is higher than that of the channel layer 3 and by compensating and adjusting the thickness thereof to the magnitude of tension strain of the channel layer 3.

[Fourth Embodiment]

Although examples in which a device is designed so that the resistance anisotropy is canceled out in the aforementioned first through third embodiments, it is also possible to positively control the resistance anisotropy in accordance the use a device and to suppress the influence of degradation of device performance due to the resistance anisotropy.

Figure 6:
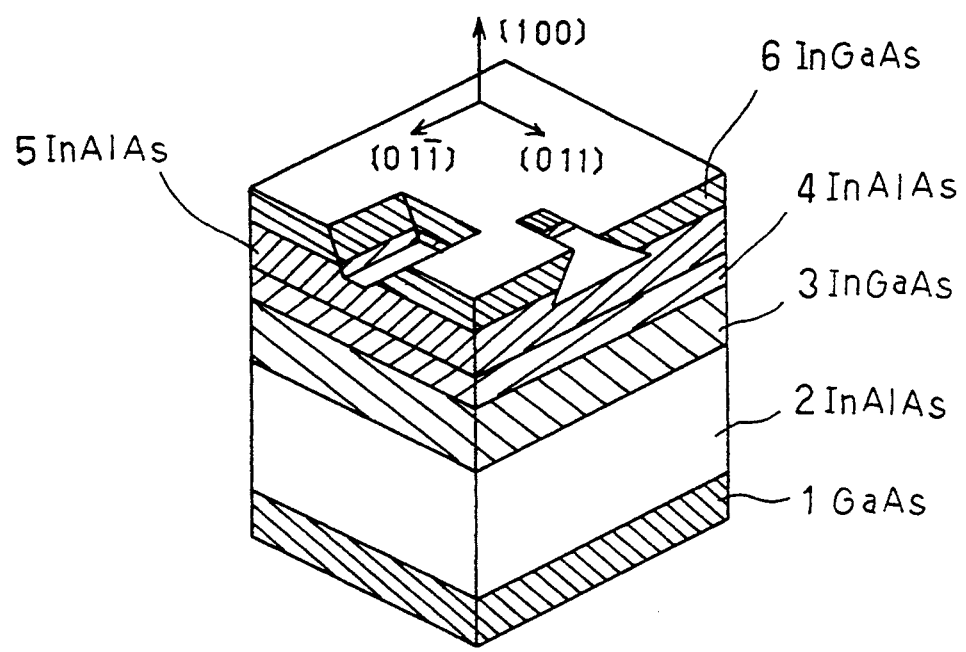
FIG. 6 is a perspective view explaining etching shapes.

Compound semiconductors such as GaAs have a nature that when it is etched, it is etched into different shapes in the [011] axial direction and [01$\bar{1}$] axial direction depending on a bond state of atoms as shown in FIG. 6. This crystal anisotropy is used to create a device that matches with the purpose of the device. For example, when a gate electrode is to be created at a recess part by carrying out a crystal anisotropic etching, the side of groove is slanted in the inverse direction (inverse mesa shape) on the cross section seen from the [011] axial direction, so that source and drain electrodes may be approached to a semiconductor layer which becomes an operating layer as close as possible in a structure in which the gate electrode is created in parallel with the [011] axis, contributing for reducing a parasitic resistance. Further, the cross section seen from the [01$\bar{1}$] direction becomes normal mesa shape and the semiconductor layer may be separated from the head of the electrode, so that it becomes a structure advantageous for improving a dielectric strength.

Here, exemplifying the layer structure shown in FIG. 1, when the resistance R [011] in the [011] axial direction and the resistance R [01$\bar{1}$] in the [01$\bar{1}$] axial direction are compared in the case when the donor layer 5 is less than 10 nm (i.e., thickness of the spacer+dope+cap layers on which tension strain is given is less than 20 nm), R [011]<R [01$\bar{1}$] as described above. Then when the thickness of the donor layer is increased to more than that, the direction in which the anisotropy is held is interchanged and it becomes R [011]>R [01$\bar{1}$].

That is, although R [011]<R [01$\bar{1}$] when the strain applied to whole device is mainly compression strain, it becomes R [011]>R [01$\bar{1}$] when tension strain becomes predominant and it can be seen that the direction of crystal axis in which the resistance is reduced is controlled by adjusting the magnitudes of compression strain and tension strain.

Therefore, when it is desired to dispose the source, gate and drain electrodes sequentially along the [011] axial direction, it is sufficient if the condition to reduce the R [011] is met, i.e. the donor layer is formed in less than 10 nm. In this case, when the surface layer is etched anisotropically to create a so-called recess gate, the width direction of the gate electrode becomes parallel to the [01$\bar{1}$] axis, so that the etching cross section presents normal mesa shape and a structure having an excellent dielectric strength may be realized. On the other hand, when it is desired to dispose the source, gate and drain electrodes along the [01$\bar{1}$] axial direction, it is sufficient if the condition to reduce the R [011] is met, i.e. the donor layer is formed in more than 10 nm. At this time, the etching cross section of the recess gate presents an inverse mesa shape and a structure which is effective in reducing the parasitic resistance may be realized.

Figure 7A:
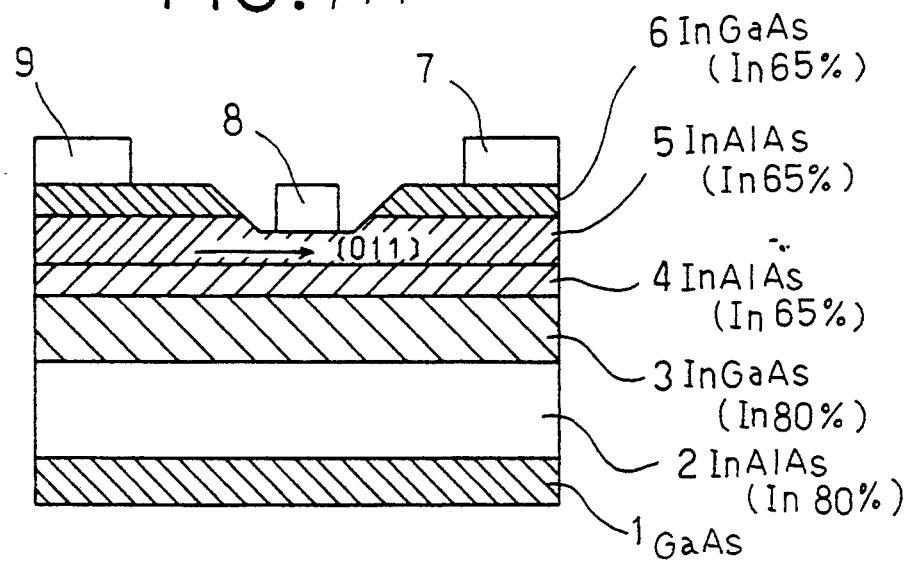
FIGS. 7A and 7B are schematic structural drawings of HEMT devices using a fourth embodiment of the invention.
Figure 7B:
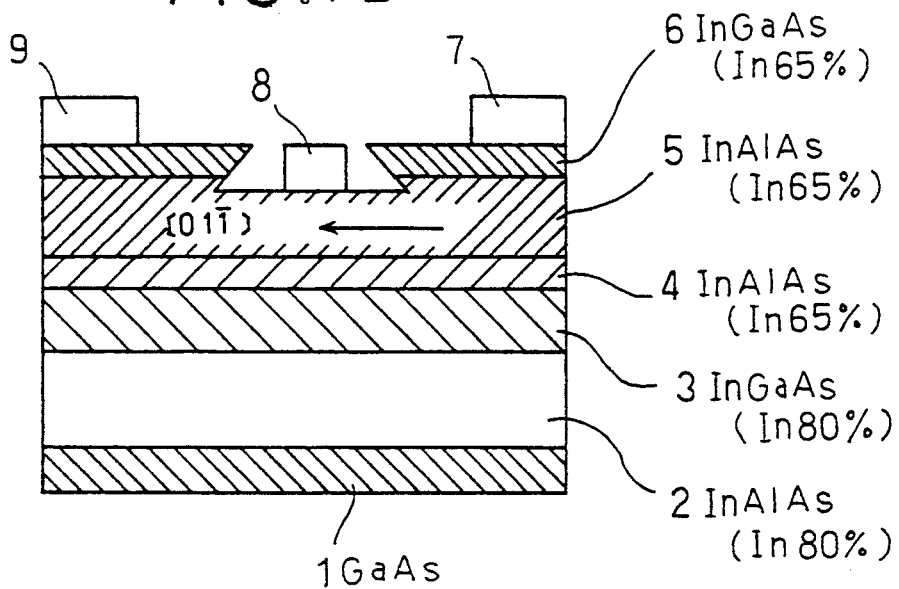

FIGS. 7A and 7B show a fourth embodiment in which the layer structure shown in FIG. 1 is actually applied to a HEMT. Arrangements of each of the semiconductor layers are the same with that shown in FIG. 1. The InAlAs buffer layer 2, InGaAs channel layer 3 (In composition is 80% in the both layers), InAlAs spacer layer 4, n-type InAlAs donor layer 5 and n-type InGaAs cap layer (In composition is 65% in the latter three layers) are laminated one by one on the semi-insulating GaAs(100) substrate 1 using MBE method.

When the donor layer 5 is thinned down to 5 nm for example, the compression strain becomes predominant in the strain applied to the whole device, so that the resistance anisotropy becomes R [011]<R [01$\bar{1}$]. When a HEMT device is to be created using this semiconductor substrate, the influence of the resistance anisotropy may be minimized by disposing the source electrode 7, gate electrode 8 and drain electrode 9 along the [011] axial direction where the resistance is small. Furthermore, when a so-called recess gate structure is adopted by forming the gate electrode 8 in a groove where the cap layer 6 is removed by etching, the etched cross section presents a normal mesa shape as shown in FIG. 7A, allowing to realize a structure having an excellent dielectric strength.

Conversely, when the donor layer 5 is thickened 30 nm for example, the tension strain becomes predominant in the strain applied to the whole device and the resistance anisotropy becomes R [011]>R [01$\bar{1}$]. Accordingly, when a HEMT device is to be created, it is sufficient if the source electrode 7, gate electrode 8 and drain electrode 9 are disposed along the [01$\bar{1}$] axial direction where the resistance is small and the etched cross section when the recess gate is created presents an inverse mesa shape as shown in FIG. 7B, allowing a structure which is advantageous for reducing the parasitic resistance. When the present embodiment is applied to the recess gate structure, the depth of the etched portion needs less than 20 nm depth so that the total thickness of the donor layer and spacer layer below the gate electrode keeps at least 20 nm depth.

Further, the 2D electron gas in which electrons travel is produced in the InGaAs channel layer 3 having high In composition ratio of 80% of In composition, so that its electron mobility is higher and electron density of the 2D electron gas may be kept large by keeping large the band discontinuity with the channel layer 3 by composing the donor layer 5 and others on the carrier supply side by 65% of In composition.

Although the InAlAs buffer layer with 80% of In composition has been formed directly on the GaAs substrate 1 in the fourth embodiment, it is sufficient if the resistance anisotropy can be canceled out in the device as a whole by applying strains in the inverse direction from each other to the channel layer 3, spacer layer 4 or donor layer 5 and some other embodiments are conceivable.

[Fifth Embodiment]

Figure 8:
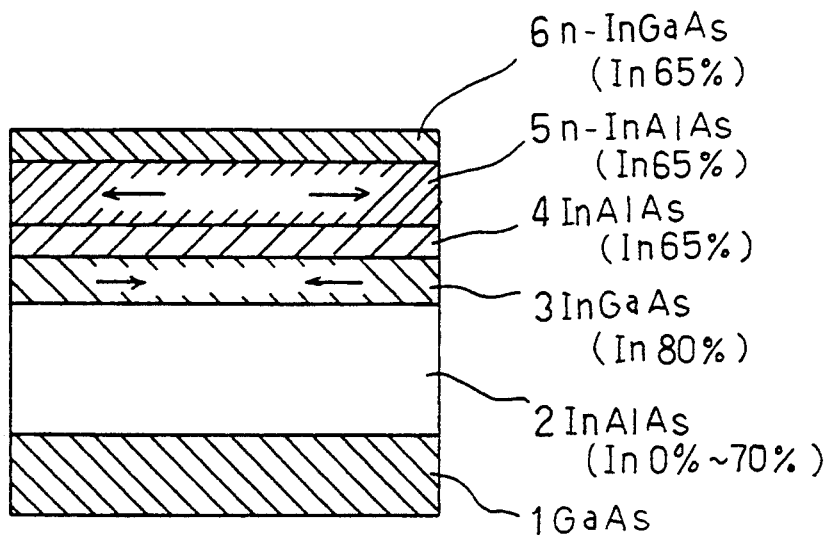
FIGS. 8 is a schematic drawing of a layer structure according to a fifth embodiment of the invention.

FIG. 8 is a schematic drawing of a layer structure according to a fifth embodiment of the invention, wherein a so-called grated buffer layer in which In composition is gradually increased from 0% is employed as the buffer layer 2 formed on the semi-insulating GaAs (100) substrate 1. This structure features in that the magnitude and direction of strain applied to the channel layer 3 are more widely adjustable by changing In composition on the uppermost surface of the grated buffer layer 2 and In composition of the channel layer 3. In the structure shown in FIG. 8, the strain applied to the channel layer 3 is compression strain, In composition at the uppermost surface of the InAlAs grated buffer layer 2 is 70%, In composition of InGaAs channel layer 3 is 80% and a tension strain is given on the upper layers of InAlAs spacer layer 4, n-InAlAs donor layer 5 and n-InGaAs cap layer 6 having 65% of In composition. It is also possible to control the resistance anisotropy and to design a device in accordance to its use in the present embodiment by adjusting the relationship of the compression magnitude of the channel layer 3 and the tension strain of the spacer, dope and cap layers on the carrier supply side in the same manner as in the fourth embodiment.

[Sixth Embodiment]

Although examples using GaAs as the material of the substrate have been shown in the aforementioned fourth and fifth embodiments, it is possible to create the same structure by using a substrate of another material capable of growing crystal such as InP and InAs and by interposing a buffer layer or a grated buffer layer whose lattice constant corresponds to that of respective substrates.

Figure 9:
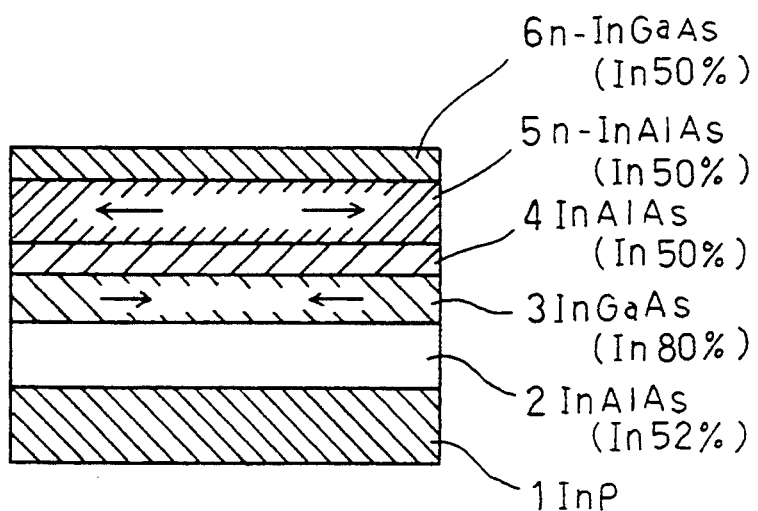
FIGS. 9 is a schematic drawing of a layer structure according to a sixth embodiment of the invention.

FIG. 9 is a schematic drawing of a layer structure according to a sixth embodiment of the invention, wherein a semi-insulating InP (100) is used for the material of the substrate 1 and the buffer layer 2 is fabricated by InAlAs with 52% of In composition whose lattice matches with InP. In this structure, the lattice of the buffer layer 2 matches with the substrate 1, differing from the aforementioned fourth and fifth embodiments, and no strain is applied to the buffer layer 2. Accordingly, it features in that strain applied to the InGaAs channel layer 3 is determined only by In composition of the channel layer and that the magnitude of strain on the channel layer may be precisely defined. That is, a compression strain is applied to the channel layer 3 by increasing In composition of the InGaAs channel layer 3 to 80% which is higher than that of the buffer layer 2 and the magnitude of the strain may be defined corresponding to the thickness thereof. On the other hand, a tension strain is given to the InAlAs spacer layer 4, n-InAlAs donor layer 5 and n-InGaAs cap layer 6 by decreasing In composition to 50% for example which is less than that of the channel layer 3, so that the magnitude of tension strain as against that of the compression strain may be controlled and the resistance anisotropy may be controlled by adjusting the thickness thereof against the magnitude of compression strain of the channel layer 3.

[Seventh Embodiment]

Figure 10:
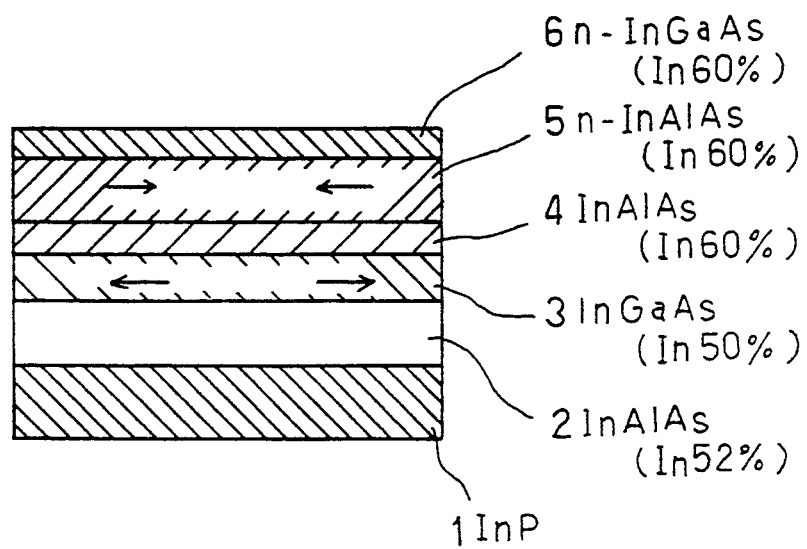
FIGS. 10 is a schematic drawing of a layer structure according to a seventh embodiment of the invention.

Further, FIG. 10 shows a schematic drawing of a layer structure according to a seventh embodiment of the present invention. Although the material of the substrate 1 and the buffer layer 2 are the same with the aforementioned sixth embodiment, the In composition of the InGaAs channel layer 3 is reduced to 50% which is less than that of the buffer layer 2 and the In composition of the InAlAs spacer layer 4, n-InAlAs donor layer 5 and the n-InGaAs cap layer 6 is increased to 60% for example which is higher than that of the channel layer 3 so that the tension strain is applied to the channel layer 3 and compression strain is applied to the donor layer 5, respectively. Accordingly, the axial direction where the resistance becomes small when the thickness of the donor layer 5 is changed is interchanged by 90° from the aforementioned fourth to sixth embodiments and when the donor layer 5 is thin, it becomes R [011]>R [01$\bar{1}$] and when the donor layer 5 is thick, it becomes R [011]<R [01$\bar{1}$]. Due to that, when a HEMT device is actually fabricated as shown in FIGS. 7A and 7B, the resistance anisotropy may be controlled so that its influence on the device performance is minimized by creating the device according to its use by shaping conversely from the case explained in the aforementioned fourth embodiment in such a manner as to thin down the donor layer 5 when the etching shape of the recess gate is desired to be an inverse mesa shape and to thicken the donor layer 5 when a normal mesa shape is desired on the other hand.

By the way, it is needless to say that the structure equivalent to the seventh embodiment is not limited only to the InP substrate and may be fabricated by interposing the grated buffer layer on a GaAs substrate for example.

What is claimed is:

1. A compound semiconductor comprising:
   a semiconductor substrate having (100) plane as a crystal growth plane;
   a first semiconductor layer for an electron traveling layer said first semiconductor layer being located on said semiconductor substrate and constituted by a material having a greater lattice constant than that of said semiconductor substrate, wherein said first semiconductor layer has a first strain in a first strain direction therein; and
   a second semiconductor layer for an electron supplying layer, said second semiconductor layer located on said first semiconductor layer and constituted by a material having a smaller lattice constant than that of said first semiconductor layer to thereby apply a second strain to said second semiconductor layer, said second strain having a direction inverse to said first strain direction, wherein a thickness ratio of said second semiconductor layer to said first semiconductor layer is used to control a dislocation running direction in said electron traveling layer and a thickness of said second semiconductor layer having a value which decreases a resistance in a (011) direction as compared to that in a (01$\bar{1}$) direction; and
   a source electrode, a gate electrode and a drain electrode disposed on said second semiconductor layer in a direction along said (011) direction in order of said source electrode, said gate electrode and said drain electrode.

2. A compound semiconductor comprising:
   a semiconductor substrate having (100) plane as a crystal growth plane;
   a first semiconductor layer for an electron traveling layer said first semiconductor layer being located on said semiconductor substrate and constituted by a material having a greater lattice constant than that of said semiconductor substrate, wherein said first semiconductor layer has a first strain in a first strain direction therein; and
   a second semiconductor layer for an electron supplying layer, said second semiconductor layer located on said first semiconductor layer and constituted by a material having a smaller lattice constant than that of said first semiconductor layer to thereby apply a second strain to said second semiconductor layer, said second strain having a direction inverse to said first strain direction, wherein a thickness ratio of said second semiconductor layer to said first semiconductor layer is used to control a dislocation running direction in said electron traveling layer and a thickness of said second semiconductor layer having a value which decreases a resistance in a (01$\bar{1}$) direction as compared to that in a (011) direction; and
   a source electrode, a gate electrode and a drain electrode disposed on said second semiconductor layer in a direction along said (01$\bar{1}$) direction in order of said source electrode, said gate electrode and said drain electrode.

3. A compound semiconductor comprising:
   a semiconductor substrate having (100) plane as a crystal growth plane;
   a first semiconductor layer for an electron traveling layer said first semiconductor layer being located on said semiconductor substrate and constituted by a material having a smaller lattice constant than that of said semiconductor substrate, wherein said first semiconductor layer has a first strain in a first strain direction therein; and
   a second semiconductor layer for an electron supplying layer, said second semiconductor layer located on said first semiconductor layer and constituted by a material having a greater lattice constant than that of said first semiconductor layer to thereby apply a second strain to said second semiconductor layer, said second strain having a direction inverse to said first strain direction, wherein a thickness ratio of said second semiconductor layer to said first semiconductor layer is used to control a dislocation running direction in said electron traveling layer and a thickness of said second semiconductor layer having a value which decreases a resistance in a (01$\bar{1}$) direction as compared to that in a (011) direction; and
   a source electrode, a gate electrode and a drain electrode disposed on said second semiconductor layer in a direction along said (01$\bar{1}$) direction in order of said source electrode, said gate electrode and said drain electrode.

4. A compound semiconductor comprising:
   a semiconductor substrate having (100) plane as a crystal growth plane;
   a first semiconductor layer for an electron traveling layer said first semiconductor layer being located on said semiconductor substrate and constituted by a material having a smaller lattice constant than that of said semiconductor substrate, wherein said first semiconductor layer has a first strain in a first strain direction therein; and a second semiconductor layer for an electron supplying layer, said second semiconductor layer located on said first semiconductor layer and constituted by a material having a greater lattice constant than that of said first semiconductor layer to thereby apply a second strain to said second semiconductor layer, said second strain having a direction inverse to said first strain direction, wherein a thickness ratio of said second semiconductor layer to said first semiconductor layer is used to control a dislocation running direction in said electron traveling layer and a thickness of said second semiconductor layer having a value which decreases a resistance in a (011) direction as compared to that in a (01$\bar{1}$) direction; and a source electrode, a gate electrode and a drain electrode disposed on said second semiconductor layer in a direction along said (011) direction in order of said source electrode, said gate electrode and said drain electrode.

* * * * *